US012567475B2

(12) United States Patent
Jacobvitz et al.

(10) Patent No.: US 12,567,475 B2
(45) Date of Patent: Mar. 3, 2026

(54) PRE-CHARACTERIZING WEAK BITS FOR INCREASED LOW DENSITY PARITY CHECK (LDPC) SPEED

(71) Applicant: SanDisk Technologies LLC, Addison, TX (US)

(72) Inventors: Adam Jacobvitz, San Jose, CA (US); Piyush Dhotre, San Jose, CA (US); Niles Yang, San Jose, CA (US); Juan Carlos Lee, San Jose, CA (US); Eran Sharon, Rishon Lezion (IL); Idan Goldenberg, Rishon Lezion (IL); Zhenni Wan, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 133 days.

(21) Appl. No.: 18/415,722

(22) Filed: Jan. 18, 2024

(65) Prior Publication Data

US 2025/0239317 A1     Jul. 24, 2025

(51) Int. Cl.
 *G11C 29/18*     (2006.01)
 *G11C 29/12*     (2006.01)
 *G11C 29/46*     (2006.01)

(52) U.S. Cl.
 CPC .......... *G11C 29/1201* (2013.01); *G11C 29/18* (2013.01); *G11C 29/46* (2013.01); *G11C 2029/1802* (2013.01)

(58) Field of Classification Search
 CPC ..... G11C 29/1201; G11C 29/18; G11C 29/46; G11C 2029/1802
 See application file for complete search history.

(56) References Cited

U.S. PATENT DOCUMENTS

| | | | |
|---|---|---|---|
| 8,832,526 B2 | 9/2014 | Tseng | |
| 9,329,928 B2 | 5/2016 | Fitzpatrick | |
| 10,366,769 B2 | 7/2019 | Cho | |
| 11,361,832 B2 | 6/2022 | Han | |
| 2016/0077914 A1* | 3/2016 | Zeng | G06F 11/1012 714/764 |
| 2023/0094363 A1 | 3/2023 | Graumann | |

* cited by examiner

*Primary Examiner* — Mohammed A Bashar
(74) *Attorney, Agent, or Firm* — Arlene Neal; NEAL BLIBO LLC

(57)     ABSTRACT

A storage device may speed up error correction by pre-characterizing weak cell information in a memory device. The storage device includes a memory device with cells that may store multiple bits. A controller executes a pre-characterization operation on the memory device to identify a slow cell and/or a fast cell on the memory device. The controller retrieves weak cell information for the slow cell and/or the fast cell. The controller converts the weak cell information into values used by an error correction engine and provides the values to the error correction engine to be used in decoding information retrieved from the memory device.

20 Claims, 5 Drawing Sheets

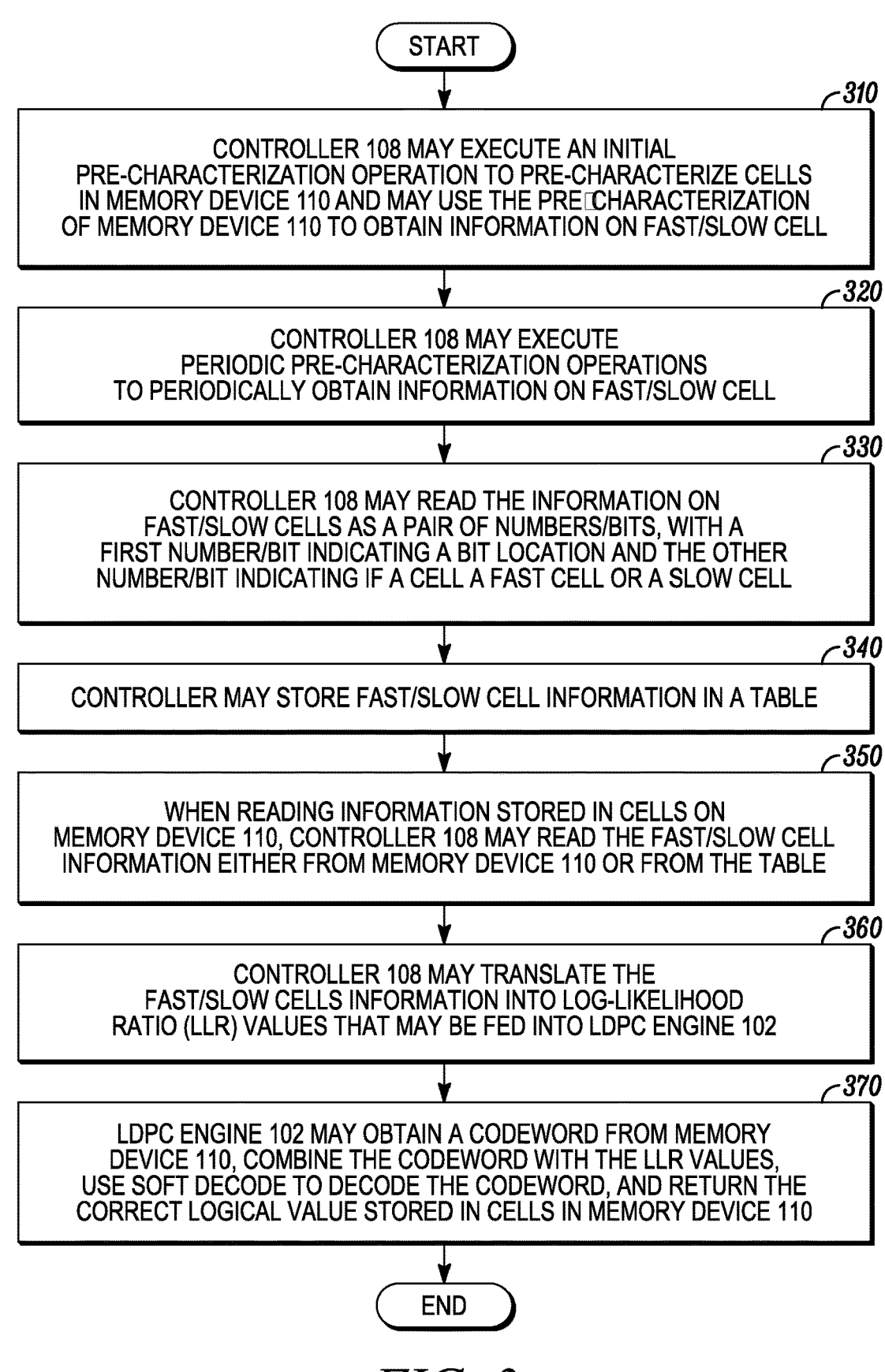

START

*310*
CONTROLLER 108 MAY EXECUTE AN INITIAL
PRE-CHARACTERIZATION OPERATION TO PRE-CHARACTERIZE CELLS
IN MEMORY DEVICE 110 AND MAY USE THE PRE⬚CHARACTERIZATION
OF MEMORY DEVICE 110 TO OBTAIN INFORMATION ON FAST/SLOW CELL

*320*
CONTROLLER 108 MAY EXECUTE
PERIODIC PRE-CHARACTERIZATION OPERATIONS
TO PERIODICALLY OBTAIN INFORMATION ON FAST/SLOW CELL

*330*
CONTROLLER 108 MAY READ THE INFORMATION ON
FAST/SLOW CELLS AS A PAIR OF NUMBERS/BITS, WITH A
FIRST NUMBER/BIT INDICATING A BIT LOCATION AND THE OTHER
NUMBER/BIT INDICATING IF A CELL A FAST CELL OR A SLOW CELL

*340*
CONTROLLER MAY STORE FAST/SLOW CELL INFORMATION IN A TABLE

*350*
WHEN READING INFORMATION STORED IN CELLS ON
MEMORY DEVICE 110, CONTROLLER 108 MAY READ THE FAST/SLOW CELL
INFORMATION EITHER FROM MEMORY DEVICE 110 OR FROM THE TABLE

*360*
CONTROLLER 108 MAY TRANSLATE THE
FAST/SLOW CELLS INFORMATION INTO LOG-LIKELIHOOD
RATIO (LLR) VALUES THAT MAY BE FED INTO LDPC ENGINE 102

*370*
LDPC ENGINE 102 MAY OBTAIN A CODEWORD FROM MEMORY
DEVICE 110, COMBINE THE CODEWORD WITH THE LLR VALUES,
USE SOFT DECODE TO DECODE THE CODEWORD, AND RETURN THE
CORRECT LOGICAL VALUE STORED IN CELLS IN MEMORY DEVICE 110

END

*FIG. 3*

PRE-CHARACTERIZING WEAK BITS FOR INCREASED LOW DENSITY PARITY CHECK (LDPC) SPEED

BACKGROUND

A storage device may be communicatively coupled to a host and to non-volatile memory including, for example, a NAND flash memory device on which the storage device may store data received from the host. The memory may be divided into physical blocks and data may be stored in the blocks in various formats, with the formats being defined by the number of bits that may be stored per memory cell. For example, a single-layer cell (SLC) format may write one bit of information per memory cell, a multi-layer cell (MLC) format may write two bits of information per memory cell, a triple-layer cell (TLC) format may write three bits of information per memory cell, and a quadruple-layer cell (QLC) format may write four bits of information per memory cell, and so on.

As more bits are stored per memory cell, the memory cell may become more subject to various device and circuit level noise, which may reduce the reliability and endurance of the memory device. The logical value a memory cell stores may be determined by a voltage threshold window (also referred to herein as a vt window). A cell's threshold voltage (also referred to herein as a vt) may lie in the vt window. As more bits are stored per cell, the vt window used to represent each value may become smaller, which may lead to increased error rates in determining a value stored in the cell. To ensure that the data being read from a cell is the same as the data that was written to the cell, low-density parity check (LDPC) codes may be used. The LDPC code is linear error correcting code that may be suitable for error correction in the presence of variation in threshold voltages used to represent values present in different cells.

The LDPC correction capability may be improved by providing information to an LDPC engine about the locations of weak bits. Weak bits may be bits in cells which change value within a small vt window (referred to herein as a weak bit vt window). The weak bit vt window may include the tails of both an upper and a lower distribution. Weak bits may be the bits in the fastest cells of the left distribution and slowest cells of the right distribution. A fast weak cell may be a cell having a voltage threshold that is incremented faster than the other cells with the same target vt during, for example, incremental step pulse programming (ISPP). A slow weak cell may be a cell having a voltage threshold that is incremented slower than the other cells with the same target vt during, for example, ISPP. The number of fast/slow weak cells may change over time and may be dependent on how much the upper and lower distributions overlap. For example, QLC may have more weak cells than TLC.

Bits in the weak bit vt window may be more likely to be detected to have the wrong value and therefore may require more correction strength than the remaining bits outside of the weak bit vt window. The bits outside of the weak bit vt window are referred to herein as strong bits. When a cell is suspected of being in the weak bit vt window, i.e., in a section where the upper and lower distributions overlap, the slow weak cells information and fast weak cells information may be provided to the LDPC engine so that the LDPC engine may use more correction strength than it would use on strong cells that are outside the weak bit vt window and likely to be coded correctly. To determine where weak cells are located, a command may be sent to the LDPC engine, wherein executing the command may take more time than executing a read command. As the storage device uses memory formats in which more bits are stored per cell, the overall performance of the storage device may be affected by the speed of the LDPC engine in determining weak cells.

SUMMARY

In some implementations, the storage device may speed up error correction by pre-characterizing weak cell information in a memory device. The storage device includes a memory device including cells that may store multiple bits. A controller executes a pre-characterization operation on the memory device to identify a slow cell and/or a fast cell on the memory device. The controller retrieves weak cell information for the slow cell and/or the fast cell. The controller converts the weak cell information into values used by an error correction engine and provides the values to the error correction engine to be used to decode information retrieved from the memory device.

In some implementations, a method is provided for speeding up error correction on a storage device by pre-characterizing weak cell information in a memory device. The method includes executing an initial pre-characterization operation or a periodic pre-characterization operation to pre-characterize cells in the memory device. The method also includes identifying a slow cell and/or a fast cell in the memory device and retrieving weak cell information for the slow cell or the fast cell. The method further includes converting the weak cell information to error correction values; and providing the error correction values to an error correction engine to be used to decode information retrieved from the memory device.

In some implementations, a storage device pre-characterizes weak cell information in a memory device to speed up error correction. The storage device includes a memory device including cells that may store multiple bits. A controller pre-characterizes cells in the memory device to identify a slow cell or a fast cell in the memory device and retrieves weak cell information for the slow cell or the fast cell. The controller converts the weak cell information to Log-Likelihood Ratio (LLR) values and provides the LLR values to a low-density parity check (LDPC) engine to be used in decoding information retrieved from the memory device.

BRIEF DESCRIPTION OF THE SEVERAL VIEWS OF THE DRAWINGS

FIG. 3 is a flow diagram of an example process for pre-characterizing weak cells to improve LDPC speed in accordance with some implementations.

Figure 1:
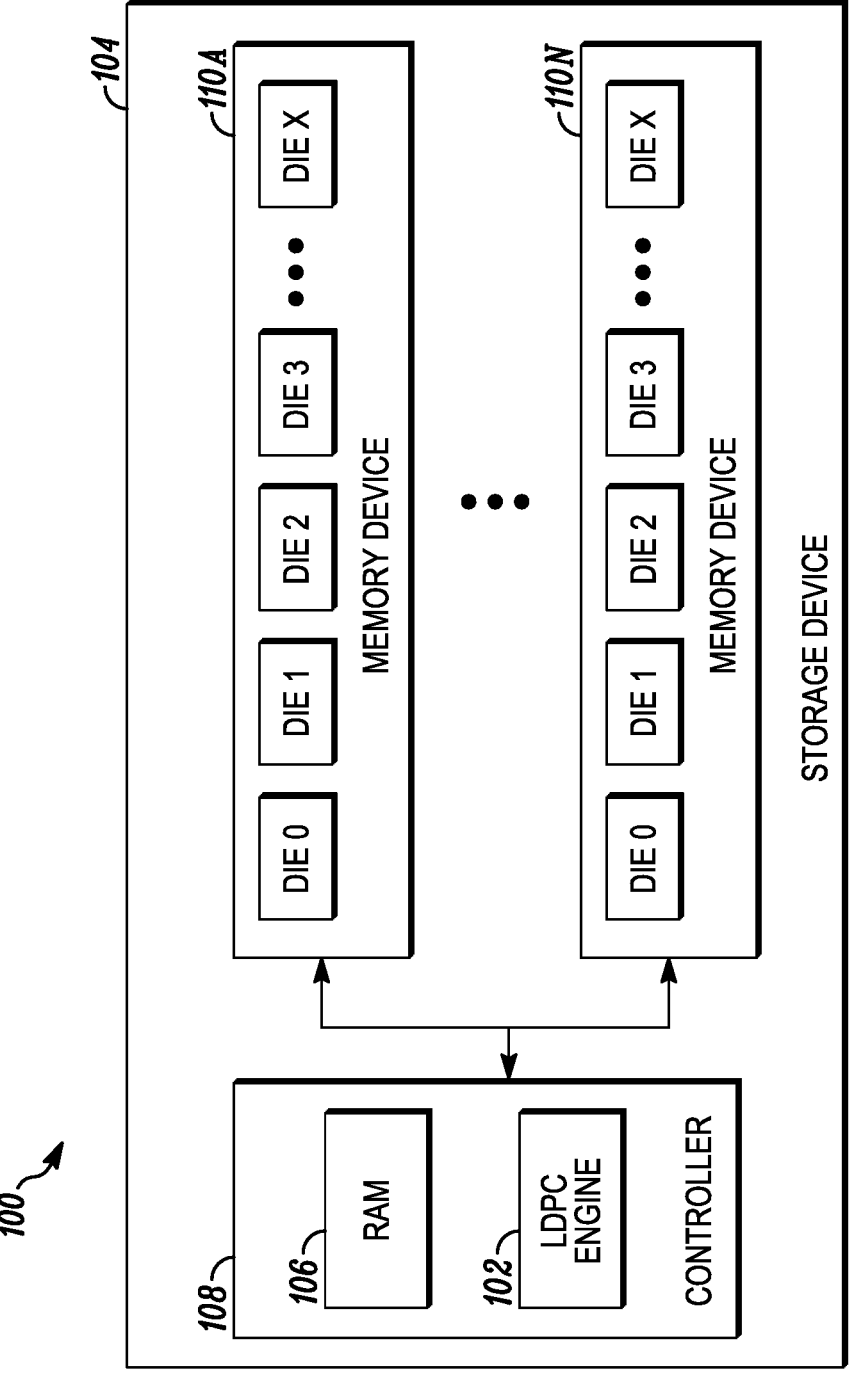
FIG. 1 is a schematic block diagram of an example storage device in accordance with some implementations.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations of the present disclosure.

The apparatus and method components have been represented where appropriate by conventional symbols in the drawings, showing those specific details that are pertinent to understanding the implementations of the present disclosure so as not to obscure the disclosure with details that will be readily apparent to those of ordinary skill in the art.

DETAILED DESCRIPTION OF THE INVENTION

The following detailed description of example implementations refers to the accompanying drawings. The same reference numbers in different drawings may identify the same or similar elements.

FIG. 1 is a schematic block diagram of an example storage device in accordance with some implementations. Storage device 104 may include a low-density parity check (LDPC) engine 102, a random-access memory (RAM) 106, a controller 108, and one or more non-volatile memory devices 110a-110n (referred to herein as the memory device (s) 110). LDPC engine 102 may be an error correction code mechanism that may use soft decoding codes to provide correction capability in the presence of significant noise in signals used to represent values in different cells. Storage device 104 may be, for example, a solid-state drive (SSD), and the like. RAM 106 may be temporary storage such as a dynamic RAM (DRAM) that may be used to cache information in storage device 104.

Controller 108 may interface with a host and process foreground operations including instructions transmitted from the host. For example, controller 108 may read data from and/or write to memory device 110 based on instructions received from the host. Controller 108 may also execute background operations to manage resources on memory device 110. For example, controller 108 may monitor memory device 110 and may execute garbage collection and other relocation functions per internal relocation algorithms to refresh and/or relocate the data on memory device 110.

Memory device 110 may be flash based. For example, memory device 110 may be a NAND flash memory that may be used for storing host and control data over the operational life of memory device 110. Memory device 110 may include multiple dies (shown as Die 0-Die X). Die 0-Die X may be divided into blocks. Memory device 110 may be included in storage device 104 or may be otherwise communicatively coupled to storage device 104.

Data may be stored in the blocks on memory device 110 in various formats, with the formats being defined by the number of bits that may be stored per memory cell. For example, a single-layer cell (SLC) format may write one bit of information per memory cell, a multi-layer cell (MLC) format may write two bits of information per memory cell, a triple-layer cell (TLC) format may write three bits of information per memory cell, and a quadruple-layer cell (QLC) format may write four bits of information per memory cell, and so on. Formats storing fewer bits in each cell are more easily accessed, durable, and less error-prone than formats storing more bits per cell. However, formats storing fewer bits in each cell are also more expensive.

The logical value a memory cell stores may be determined by the voltage window (also referred to herein as a vt window) including a threshold voltage (also referred to herein as a vt). When a cell stores more than two or more bits, a narrowed threshold voltage range may cause more errors. To correctly retrieve data written in cells including two or more bits, controller 108 may speed up LDPC engine

102 capabilities by providing weak bit information to LDPC engine 102. The weak bit information may be associated with cells with changed threshold voltage values within a weak bit vt window. The weak bit vt window may include one or more fast cells, i.e., cells with a threshold voltage that is incremented faster than the other cells with the same target vt during programming. The weak bit vt window may also include one or more slow cells, i.e., cells with a threshold voltage that is incremented slower than the other cells with the same target vt. Information associated with the fast cell(s) and the slow cell(s) in the weak bit vt window may be referred to herein as weak bit information or fast/slow cell information.

In an implementation, controller 108 may pre-characterize cells in memory device 110 and may use the pre-characterization of memory device 110 to obtain fast/slow cell information. For instance, during a pre-characterization operation, controller 108 may execute an initial test mode on memory device 110, wherein the test mode may return bits corresponding to fast/slow cells. Controller 108 may obtain the slow/fast cell information for each verify level for each state. Controller 108 may identify slow cells as cells that do not pass a program verify operation after a programming operation. In an example, controller 108 may identify slow cells by adjusting a bit scan program failure (BSPF) for programming. Controller 108 may identify fast cells as cells that pass a program verify with the fewest number of pulses when compared with other cells with the same target vt.

In another implementation, controller 108 may execute the pre-characterization operation and obtain fast/slow cell information periodically. For example, controller 108 may execute a periodic test mode in memory device 110 that may return the bits corresponding to the fast/slow cells. Once controller 108 identifies the fast/slow cells, whether through an initial or periodic pre-characterization operation, controller 108 may translate the fast/slow cell information into bits using, for example, a static map that may be provided to LDPC engine 102. The format of the fast/slow cell information may include pairs of numbers/bits, wherein a first number/bit in the pair may indicate a bit location and a second number/bit in the pair may indicate if a cell a fast cell or a slow cell. In some instances, the information on fast/slow cells may be ranked in order of the speed of the cells.

The fast/slow cell information may be stored, for example, in RAM 106. In an example, controller 108 may store information for a predefined number of cells per state (for example, the top fast/slow per state) in the table. Some wordline(s) in blocks in memory device 110 may have similar or the same fast or slow cells. Controller 108 may thus group wordlines having similar or the same fast or slow cells (referred to herein as corresponding wordlines) by, for example, regions, zones, or a number of ways. The slow/fast cells information for characterized wordline(s) may be sent as weak bits down to LDPC engine 102. Controller 108 may also split entries in a fast/slow cell data table based on different criteria including, for example, the location read on memory device 110, depending on the fast/slow cell behavior, and/or different temperature, read disturb, and/or data retention conditions. As an alternative, the fast/slow cell information may be read out on demand replacing a C2h read (i.e., a soft-bit read command that may help to determine bits in the Vt window that are probable to be wrongly detected. i.e. 0 vs 1) in the NAND, assuming reading the fast/slow cell information on demand is faster than the C2h read.

During a read operation, controller 108 may read the fast/slow cells information either from memory device 110 or from the table. Controller 108 may translate the fast/slow cells information into Log-Likelihood Ratio (LLR) values that may be fed into LDPC engine 102. LDPC engine 102 may obtain a codeword including the underlying data from memory device 110 and may combine the codeword with the LLR values. LDPC engine 102 may then use soft decode to decode the codeword from memory device 110 and return the correct logical value stored in cells in memory device 110. Rather than sending a command to LDPC engine 102 to determine where weak cells are located, by pre-characterizing weak cells in memory device 110 and sending the LLR values corresponding to fast/slow cells information to LDPC engine 102, storage device 104 may increase the speed of LDPC engine 102.

Storage device 104 may perform these processes based on a processor, for example, controller 108 executing software instructions stored by a non-transitory computer-readable medium, such as storage component 110. As used herein, the term "computer-readable medium" refers to a non-transitory memory device. Software instructions may be read into storage component 110 from another computer-readable medium or from another device. When executed, software instructions stored in storage component 110 may cause controller 108 to perform one or more processes described herein. Additionally, or alternatively, hardware circuitry may be used in place of or in combination with software instructions to perform one or more processes described herein. Thus, implementations described herein are not limited to any specific combination of hardware circuitry and software. System 100 may include additional components (not shown in this figure for the sake of simplicity). FIG. 1 is provided as an example. Other examples may differ from what is described in FIG. 1.

Figure 2:
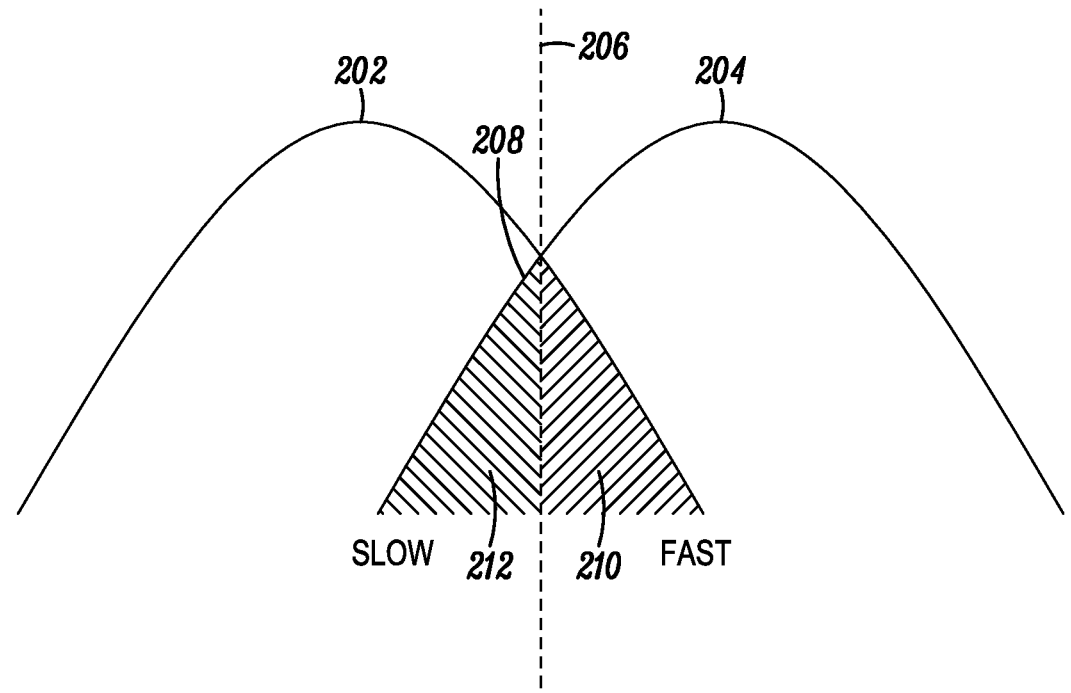
FIG. 2 is an example diagram showing distributions including weak cells in accordance with some implementations.

FIG. 2 is an example diagram showing distributions including weak cells in accordance with some implementations. A memory cell may include multiple threshold voltage states, wherein each threshold voltage state may be represented by a threshold voltage window. For example, vt window 202 may represent a first threshold voltage state and vt window 204 may represent a second threshold voltage state. The diagram also includes a reference voltage 206.

Vt window 202 includes one or more fast cells 210, i.e., a cell having a threshold voltage that is incremented faster than other cells in vt window 202 during programming. Fast cell 210 may be identified as a cell that passes a program verify with the fewest pulses. Vt window 204 includes one or more slow cells 212, i.e., a cell having a threshold voltage that is incremented slower than other cells in vt window 204 during programming. Slow cell 212 may be identified as a cell that does not pass a program verify after programming. As such vt window 202 shifts to the right across reference voltage 206 and vt window 204 shifts to the left across reference voltage 206, forming a weak bit vt window 208. Once controller 108 identifies the fast/slow cells, controller 108 may translate the fast/slow cell information into bits using, for example, a static map that may be provided to LDPC engine 102. The bits in weak bit vt window 208 are more likely to be found to have incorrect values and may thus need more correction strength than the remaining strong bits in vt window 202 and vt window 204. FIG. 2 is provided as an example. Other examples may differ from what is described in FIG. 2.

FIG. 3 is a flow diagram of an example process for pre-characterizing weak cells to improve LDPC speed in accordance with some implementations. At 310, controller

108 may execute an initial pre-characterization operation to pre-characterize cells in memory device 110 and may use the pre-characterization of memory device 110 to obtain information on fast/slow cells. At 320, controller 108 may execute periodic pre-characterization operations to periodically obtain information on fast/slow cells. At 330, controller 108 may read the information on fast/slow cells as a pair of numbers/bits, with a first number/bit indicating a bit location and the other number/bit indicating if a cell a fast cell or a slow cell. At 340, controller may store fast/slow cell information in a table.

At 350, when reading information stored in cells on memory device 110, controller 108 may read the fast/slow cell information either from memory device 110 or from the table. At 360, controller 108 may translate the fast/slow cells information into Log-Likelihood Ratio (LLR) values that may be fed into LDPC engine 102. At 370, LDPC engine 102 may obtain a codeword from memory device 110, combine the codeword with the LLR values, use soft decode to decode the codeword, and return the correct logical value stored in cells in memory device 110. As indicated above FIG. 3 is provided as an example. Other examples may differ from what is described in FIG. 3.

Figure 4:
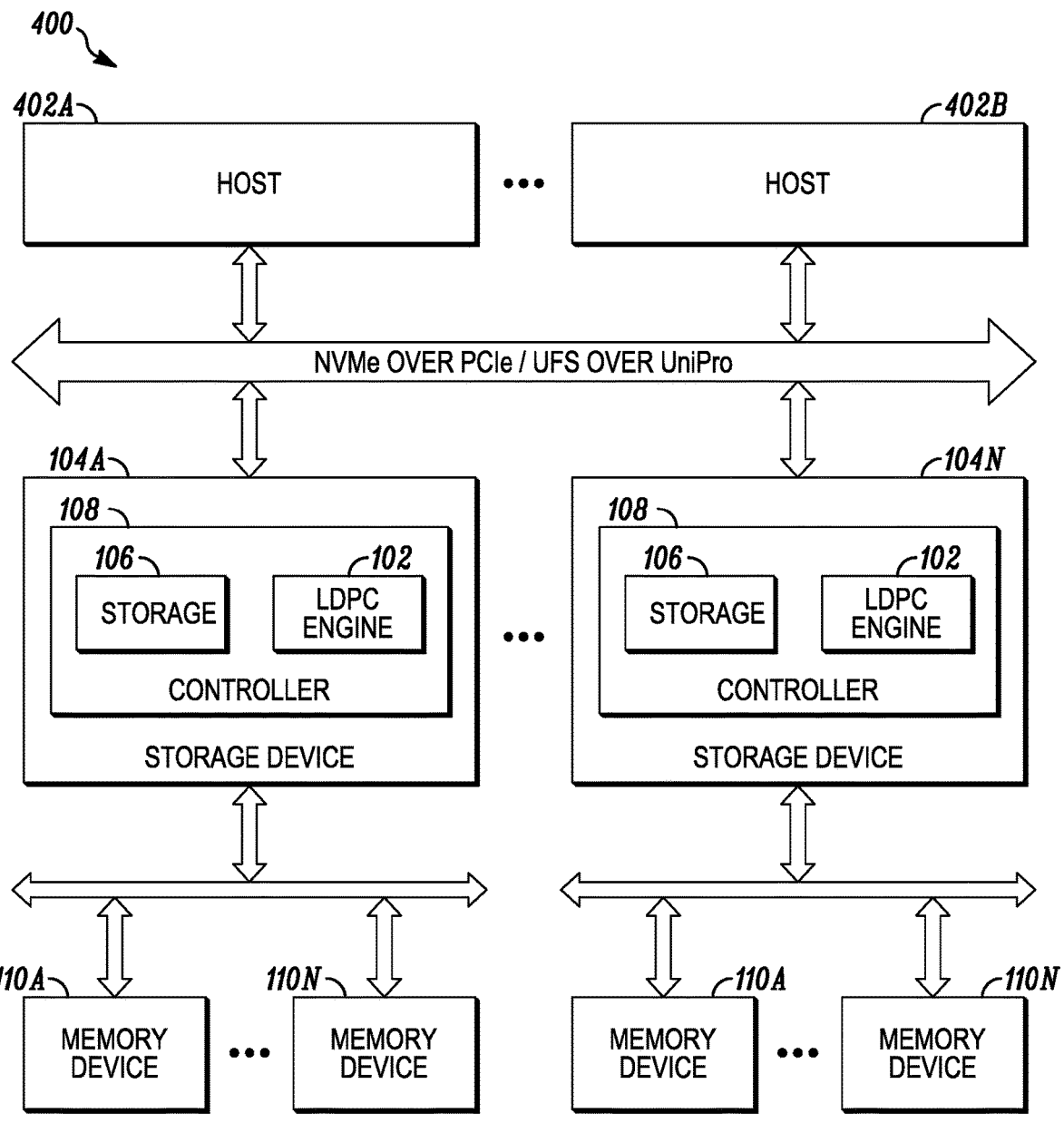
FIG. 4 is a diagram of an example environment in which systems and/or methods described herein are implemented.

FIG. 4 is a diagram of an example environment in which systems and/or methods described herein are implemented. As shown in FIG. 4, Environment 400 may include hosts 402-402*n* (referred to herein as host(s) 402), and storage devices 104*a*-104*n* (referred to herein as storage device(s) 104).

Storage device 104 may include a controller 108 to manage the resources on storage device 104. Controller 108 may speed up error correction during a read operation by pre-characterizing fast and/or slow cells in memory device 110 and converting the fast/slow cell information to values that may be used LDPC engine 102 to decode data retrieved from memory device 110. Hosts 402 and storage devices 104 may communicate via Non-Volatile Memory Express (NVMe) over peripheral component interconnect express (PCI Express or PCIe) standard, the Universal Flash Storage (UFS) over Unipro, or the like.

Devices of Environment 400 may interconnect via wired connections, wireless connections, or a combination of wired and wireless connections. For example, the network of FIG. 4 may include a cellular network (e.g., a long-term evolution (LTE) network, a code division multiple access (CDMA) network, a 3G network, a 4G network, a 5G network, another type of next-generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 4 are provided as an example. In practice, there may be additional devices and/or networks, fewer devices and/or networks, different devices and/or networks, or differently arranged devices and/or networks than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of Environment 400 may perform one or more functions described as being performed by another set of devices of Environment 400.

Figure 5:
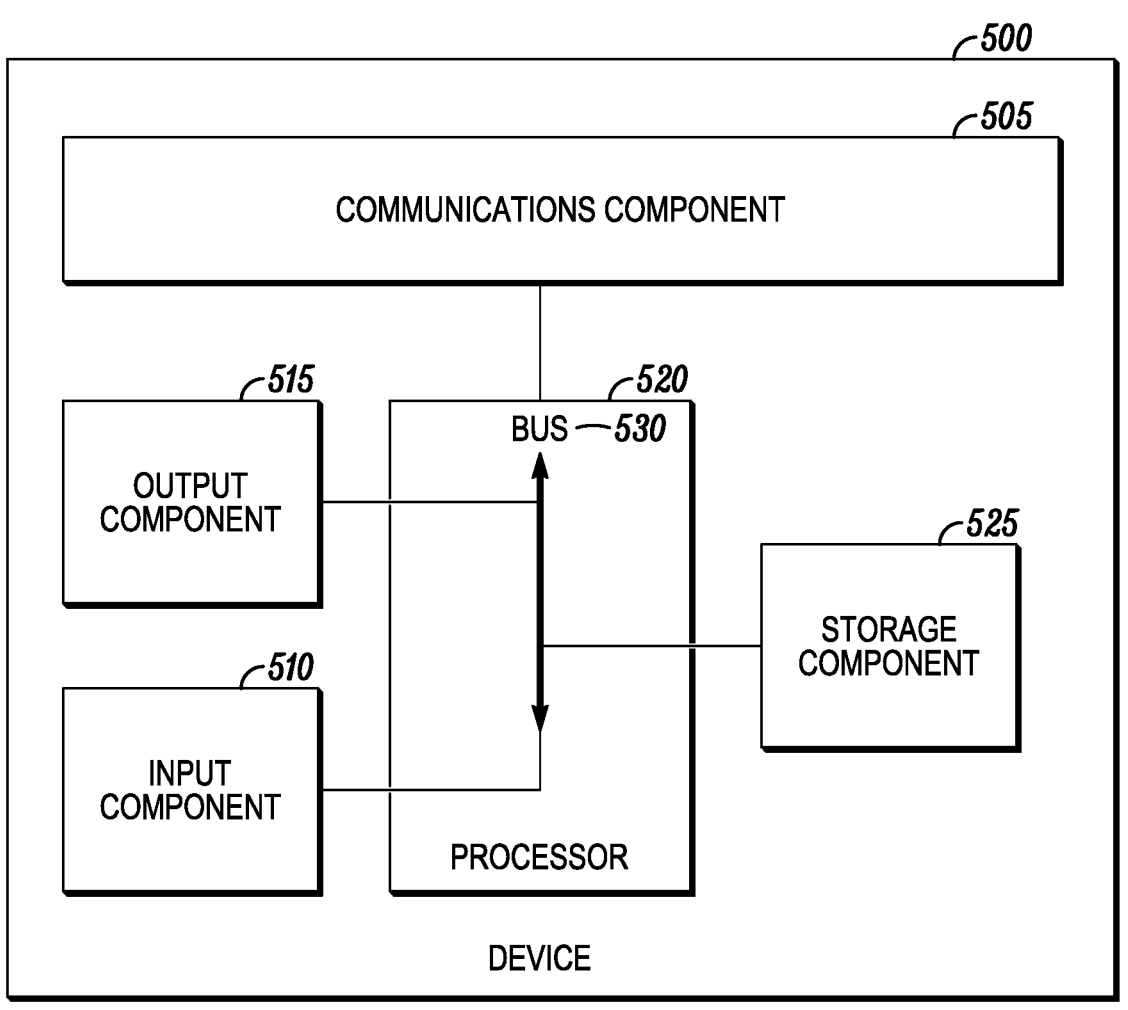
FIG. 5 is a diagram of example host which may include the storage device of FIG. 1.

FIG. 5 is a diagram of example host which may include the storage device of FIG. 1. In some implementations, host 402 may include one or more devices 500 and/or one or more components of device 500. Device 500 may include, for example, a communications component 505, an input component 510, an output component 515, a processor 520, a storage component 525, and a bus 530. Bus 530 may include components that enable communication among multiple components of device 500, wherein components of device 500 may be coupled to be in communication with other components of device 500 via bus 530.

Input component 510 may include components that permit device 500 to receive information via user input (e.g., keypad, a keyboard, a mouse, a pointing device, a microphone, and/or a display screen), and/or components that permit device 500 to determine the location or other sensor information (e.g., an accelerometer, a gyroscope, an actuator, another type of positional or environmental sensor). Output component 515 may include components that provide output information from device 500 (e.g., a speaker, display screen, and/or the like). Input component 510 and output component 515 may also be coupled to be in communication with processor 520.

Processor 520 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 may include one or more processors capable of being programmed to perform a function. Processor 520 may be implemented in hardware, firmware, and/or a combination of hardware and software.

Storage component 525 may include one or more memory devices, such as random-access memory (RAM) 106, read-only memory (ROM), and/or another type of dynamic or static storage device (e.g., a flash memory, a magnetic memory, and/or optical memory) that stores information and/or instructions for use by processor 520. A memory device may include memory space within a single physical storage device or memory space spread across multiple physical storage devices. Storage component 525 may also store information and/or software related to the operation and use of device 500. For example, storage component 525 may include a hard disk (e.g., a magnetic disk, an optical disk, and/or a magneto-optic disk), a solid-state drive (SSD), a compact disc (CD), a digital versatile disc (DVD), a floppy disk, a cartridge, a magnetic tape, and/or another type of non-transitory computer-readable medium, along with a corresponding drive.

Communications component 505 may include a transceiver-like component that enables device 500 to communicate with other devices, such as via a wired connection, a wireless connection, or a combination of wired and wireless connections. The communications component 505 may permit device 500 to receive information from another device and/or provide information to another device. For example, communications component 505 may include an Ethernet interface, an optical interface, a coaxial interface, an infrared interface, a radio frequency (RF) interface, a universal serial bus (USB) interface, a Wi-Fi interface, and/or a cellular network interface that may be configurable to communicate with network components, and other user equipment within its communication range. Communications component 505 may also include one or more broadband and/or narrowband transceivers and/or other similar types of wireless transceiver configurable to communicate via a wireless network for infrastructure communications. Communications component 505 may also include one or more local area network or personal area network transceivers, such as a Wi-Fi transceiver or a Bluetooth transceiver.

Device 500 may perform one or more processes described herein. For example, device 500 may perform these processes based on processor 520 executing software instructions stored by a non-transitory computer-readable medium, such as storage component 525. As used herein, the term "computer-readable medium" refers to a non-transitory memory device. Software instructions may be read into storage component 525 from another computer-readable medium or from another device via communications component 505. When executed, software instructions stored in storage component 525 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

The foregoing disclosure provides illustrative and descriptive implementations but is not intended to be exhaustive or to limit the implementations to the precise form disclosed herein. One of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of present teachings.

As used herein, the term "component" is intended to be broadly construed as hardware, firmware, and/or a combination of hardware and software. It will be apparent that systems and/or methods described herein may be implemented in different forms of hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related items, unrelated items, and/or the like), and may be used interchangeably with "one or more." The term "only one" or similar language is used where only one item is intended. Further, the phrase "based on" is intended to mean "based, at least in part, on" unless explicitly stated otherwise.

Moreover, in this document, relational terms such as first and second, top and bottom, and the like, may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", or "contains . . . a" does not, without more constraints, preclude the existence of additional identical elements in the process, method, article, or apparatus that comprises, has, includes, contains the element. The terms "substantially", "essentially", "approximately", "about" or any other version thereof, are defined as being close to as understood by one of ordinary skill in the art, and in one non-limiting implementation, the term is defined to be within 10%, in another implementation within 5%, in another implementation within 1% and in another implementation within 0.5%. The term "coupled" as used herein is defined as connected, although not necessarily directly and not necessarily mechanically. A device or structure that is "configured" in a certain way is configured in at least that way but may also be configured in ways that are not listed.

We claim:

1. A storage device pre-characterizes weak cell information in a memory device to speed up error correction, the storage device comprises:

a memory device including cells, wherein a cell in the memory device stores multiple bits; and a controller to pre-characterize cells in the memory device to identify at least one of a slow cell and a fast cell based on a threshold voltage in the memory device, retrieve weak cell information for at least one of the slow cell and the fast cell, wherein the weak cell information is associated with a changed threshold voltage value in a weak bit voltage threshold window, convert the weak cell information into error correction values used by an error correction engine, and provide the error correction values to the error correction engine to be used to decode information retrieved from the memory device.

2. The storage device of claim 1, wherein the error correction engine is a low-density parity check (LDPC) engine, and the controller converts the weak cell information to Log-Likelihood Ratio (LLR) values that are inputted to the LDPC engine.

3. The storage device of claim 1, wherein the controller pre-characterizes the cells in the memory device by executing an initial test mode on the memory device.

4. The storage device of claim 1, wherein the controller pre-characterizes the cells in the memory device by executing a periodic test mode on the memory device.

5. The storage device of claim 1, wherein the weak cell information includes a first bit to indicate a bit location and a second bit to indicate when a cell is one of the slow cell and the fast cell.

6. The storage device of claim 1, wherein the weak cell information is ranked based on cell speed.

7. The storage device of claim 1, wherein the controller stores the weak cell information in a table, wherein the weak cell information is associated with a predefined number of cells per state.

8. The storage device of claim 1, wherein the controller stores the weak cell information in a table and the controller splits entries in the table based on at least one of a location read, cell behavior, temperature conditions, read disturb conditions, and data retention conditions.

9. The storage device of claim 1, wherein the controller obtains the weak cell information for corresponding wordlines and groups the corresponding wordlines.

10. The storage device of claim 1, wherein the controller identifies a slow cell as a cell that does not pass a program verify operation and the controller identifies a fast cell as a cell that passes a program verify operation a fewest number of pulses.

11. A method for pre-characterizing weak cell information in a memory device to speed up error correction on a storage device, the storage device comprises a controller to execute the method comprising:

executing one of an initial pre-characterization operation and a periodic pre-characterization operation to pre-characterize cells in the memory device;

identifying at least one of a slow cell and a fast cell in the memory device based on a threshold voltage;

retrieving weak cell information for at least one of the slow cell and the fast cell, wherein the weak cell information is associated with a changed threshold voltage value in a weak bit voltage threshold window;

converting the weak cell information to error correction values; and providing the error correction values to an error correction engine to be used to decode information retrieved from the memory device.

12. The method of claim 11, wherein executing the initial pre-characterization operation comprises executing an initial test mode on the memory device.

13. The method of claim 11, wherein executing the periodic pre-characterization operation comprises executing a periodic test mode on the memory device.

14. The method of claim 11, wherein the weak cell information includes a first bit to indicate a bit location and a second bit to indicate when a cell is one of the slow cell and the fast cell.

15. The method of claim 11, further comprising ranking the weak cell information based on cell speed.

16. The method of claim 11, further comprising storing the weak cell information in a table, wherein the weak cell information is associated with a predefined number of cells per state.

17. The method of claim 11, further comprising storing the weak cell information in a table and splitting entries in the table based on at least one of a location read, cell behavior and temperature conditions.

18. The method of claim 11, further comprising obtaining the weak cell information for corresponding wordlines and grouping the corresponding wordlines.

19. The method of claim 11, wherein the identifying comprises identifying a slow cell as a cell that does not pass a program verify operation and identifying s a fast cell as a cell that passes a program verify operation a fewest number of pulses.

20. A storage device pre-characterizes weak cell information in a memory device to speed up error correction, the storage device comprises:

a memory device including cells, wherein a cell in the memory device stores multiple bits; and a controller to pre-characterize cells in the memory device to identify at least one of a slow cell and a fast cell in the memory device based on a threshold voltage, retrieve weak cell information for at least one of the slow cell and the fast cell, wherein the weak cell information is associated-with a changed threshold voltage value in a weak bit voltage threshold window, convert the weak cell information to Log-Likelihood Ratio (LLR) values, and provide the LLR values to a low-density parity check (LDPC) engine to be used to decode a codeword retrieved from the memory device and return a logical value stored in a cell on the memory device.

* * * * *